(12) United States Patent
Alvidrez (10) Patent No.: US 10,875,184 B2
(45) Date of Patent: Dec. 29, 2020

(54) REMOTE CONTROL BATTERY COMPARTMENT COVER REMOVAL SYSTEMS AND METHODS

(71) Applicant: DISH Network L.L.C., Englewood, CO (US)

(72) Inventor: Aldo Alvidrez, El Paso, TX (US)

(73) Assignee: DISH Network L.L.C., Englewood, CO (US)

( * ) Notice: Subject to any disclaimer, the term of this patent is extended or adjusted under 35 U.S.C. 154(b) by 216 days.

(21) Appl. No.: 16/124,518

(22) Filed: Sep. 7, 2018

(65) Prior Publication Data

US 2020/0078949 A1 Mar. 12, 2020

(51) Int. Cl.
| | |
|---|---|
| *B25J 9/16* | (2006.01) |
| *B25J 18/02* | (2006.01) |
| *B23P 19/04* | (2006.01) |
| *B25J 11/00* | (2006.01) |
| *B25J 9/14* | (2006.01) |
| *B25J 15/00* | (2006.01) |
| *B25J 9/00* | (2006.01) |
| *B23P 6/00* | (2006.01) |

(52) U.S. Cl.
CPC .............. *B25J 9/1694* (2013.01); *B23P 19/04* (2013.01); *B25J 9/0096* (2013.01); *B25J 9/144* (2013.01); *B25J 9/1679* (2013.01); *B25J 11/005* (2013.01); *B25J 15/0019* (2013.01); *B25J 18/02* (2013.01); *B23P 6/00* (2013.01)

(58) Field of Classification Search
CPC ...... B25J 9/1694; B25J 18/02; B25J 15/0019; B25J 9/0096; B25J 9/144; B25J 9/1679; B23P 6/00; B23P 19/04
See application file for complete search history.

(56) References Cited

U.S. PATENT DOCUMENTS

| 4,274,802 A | * | 6/1981 | Inaba | ....................... B25J 9/101 |
| | | | | 414/591 |
| 4,652,204 A | * | 3/1987 | Arnett | ...................... B25J 5/007 |
| | | | | 212/901 |

FOREIGN PATENT DOCUMENTS

WO    WO-03101675 A1 * 12/2003 .......... B25J 15/0061

* cited by examiner

*Primary Examiner* — Jermie E Cozart
(74) *Attorney, Agent, or Firm* — Kilpatrick Townsend & Stockton LLP (57) ABSTRACT

Various arrangements for remote control battery compartment cover removal systems and methods are presented. A sensor may measure the distance from the sensor to a remote control that is inserted into a housing. An extendable arm may have a compressible impact component, such that when the extendable arm is extended from an unextended position and the remote control is inserted into the housing, the compressible impact component actuates a latching mechanism of the remote control's battery compartment cover.

12 Claims, 8 Drawing Sheets

REMOTE CONTROL BATTERY COMPARTMENT COVER REMOVAL SYSTEMS AND METHODS

BACKGROUND

When a person acquires a remote control for use in controlling electronic equipment, typically one of the first actions needing to be performed is installation of batteries in the remote control. In some situations, such as if the equipment is leased, rented, or otherwise provided on a temporary basis, a provider may receive the remote control back with old batteries still installed. Having an agent of the provider manually remove battery compartment covers on every received remote control in order to remove the old batteries may be inefficient and may lead to repetitive motion induced injuries.

SUMMARY

Various embodiments are described related to a remote control battery compartment cover removal system. In some embodiments, a remote control battery compartment cover removal system is described. The system may include a frame. The system may include a housing, attached with the frame. The housing may be shaped to allow at least a portion of a remote control to be inserted into the housing. The housing may provide access to a battery compartment cover of the remote control when the remote control may be inserted into the housing. The system may include a sensor, attached with the frame, that measures a plurality of distance measurements from the sensor to the remote control when the remote control may be inserted into the housing. The system may include an extendable arm, attached with the frame, that may be extended at least partially based on one or more distance measurements of the plurality of distance measurements measured by the sensor. The system may include a compressible impact component, attached with the extendable arm, that may be extended beyond an end of the extendable arm. The compressible impact component may be attached with the extendable arm, such that when the extendable arm may be extended from an unextended position and the remote control may be inserted into the housing, the compressible impact component may actuate a latching mechanism of the battery compartment cover.

Embodiments of such a system may include one or more of the following features: The system may include an ejection tray, attached with the frame, positioned to receive the battery compartment cover when the compressible impact component has actuated the latching mechanism of the battery compartment cover and the extendable arm has been retracted. Gravity may cause the battery compartment cover to fall into the ejection tray when the compressible impact component has actuated the latching mechanism of the battery compartment cover and the extendable arm has been retracted. The processor may be configured to receive the plurality of distance measurements and to control the extendable arm at least partially based on the plurality of distance measurements. The processor may be configured to receive a distance measurement of the plurality of distance measurements. The distance measurement may be made by the sensor after the extendable arm has been extended and retracted to the unextended position and the remote control remains inserted into the housing. The processor may be further configured to determine, based on the distance measurement, that the battery compartment cover remains attached to the remote control. The processor may be further configured to, in response to determining that the battery compartment cover remains attached to the remote control, cause the extendable arm to again extend from the unextended position such that the compressible impact component actuates the latching mechanism of the battery compartment cover again. The processor may be configured to determine, based on the distance measurement, that the battery compartment cover has been detached from the remote control. The processor may be further configured to, in response to determining that the battery compartment cover has been detached from the remote control, cause the extendable arm to remain in the unextended position at least until the remote control may be removed from the housing. The compressible impact component may be rounded and rubber. The extendable arm may be caused to extend and retract using pneumatics. The remote control may be a television set top box (STB) remote control.

In some embodiments, a method for removing a remote control battery compartment cover is described. The method may include receiving a remote control having a latched remote control battery compartment cover, the remote control being received by a housing that provides access to the latched remote control battery compartment cover of the remote control when the remote control may be inserted into the housing. The method may include measuring, using a distance sensor, one or more distance measurements to the latched remote control battery compartment door. The method may include extending an extendable arm based on the one or more distance measurements measured by the distance sensor. Extending the extendable arm may cause a compressible impact component to impact the latched remote control battery compartment cover and attempt to unlatch the latched remote control battery compartment cover. The method may include retracting the extendable arm to an unextended position such that the compressible impact component may be moved away from the remote control battery compartment cover.

Embodiments of such a method may include one or more of the following features: Extending the extendable arm may cause the remote control battery compartment cover to be transferred to an ejection tray. Gravity may cause the remote control battery compartment cover to fall into the ejection tray when the compressible impact component has actuated the latching mechanism of the remote control battery compartment cover and the extendable arm has been retracted. The method may further include measuring a distance measurement after the extendable arm has been extended and retracted to an unextended position and the remote control remains inserted into the housing. The method may include determining, based on the distance measurement, that the remote control battery compartment cover remains latched with the remote control. The method may include, in response to determining that the remote control battery compartment cover remains attached to the remote control, extending the extendable arm from the unextended position to an extended position such that the compressible impact component actuates a latching mechanism of the remote control battery compartment cover. The method may include determining, based on the distance measurement, that the remote control battery compartment cover has been detached from the remote control. The method may include, in response to determining that the remote control battery compartment cover has been detached from the remote control, cause the extendable arm to remain in the unextended position at least until the remote control may be removed from the housing. The extendable arm may be caused to extend and retract using pneumatics. The remote control may be a television set top box (STB) remote control.

In some embodiments, an apparatus for removing a remote control battery compartment cover from a remote control is described. The apparatus may include means for holding a remote control having a latched battery compartment cover such that access to a battery compartment cover of the remote control may be provided. The apparatus may include means for measuring a distance measurement to the latched battery compartment cover. The apparatus may include means for extending an extendable arm based on the distance measurement. Extending the extendable arm causes an impact component to impact the latched battery compartment cover and attempt to unlatch the latched battery compartment cover. The apparatus may include means for retracting the extendable arm to an unextended position such that the impact component may be moved away from the remote control battery compartment cover.

DETAILED DESCRIPTION

A remote control may have a battery compartment cover (which can also be referred to as a door) that covers and helps keep one or more batteries installed within a battery compartment of a remote control. Embodiments detailed herein are directed to devices, systems, and methods that can be used to remove the battery compartment cover. By removing the battery compartment cover of remote controls, a user (e.g., an agent of a provider of the remote controls) or other device or system can more efficiently remove batteries from the battery compartment. Such an arrangement may allow a user to remove battery compartment covers quicker, with less fatigue from performing a repetitive action, and/or with less likelihood of damaging a latching mechanism of the battery compartment cover that secures the battery compartment cover to the remote control.

Embodiments detailed herein include an extendable arm that causes a compressible impact component to be pressed on or near a latching mechanism of a battery compartment cover of a remote control when the remote control is inserted into a housing. The compressible impact component may be pushed against the tab in response to a sensor determining that the remote control has been fully inserted into the housing. The compressible impact component may be retracted after impacting the latching mechanism. If the battery compartment cover disengages from the remote control and falls away, an extendible arm to which the compressible impact component is attached may be kept in a retracted position. If the battery compartment cover remains engaged or latched to the remote control, the extendible arm may be extended again for a second (and subsequent) attempt to disengage the latching mechanism using the compressible impact component.

Figure 1:
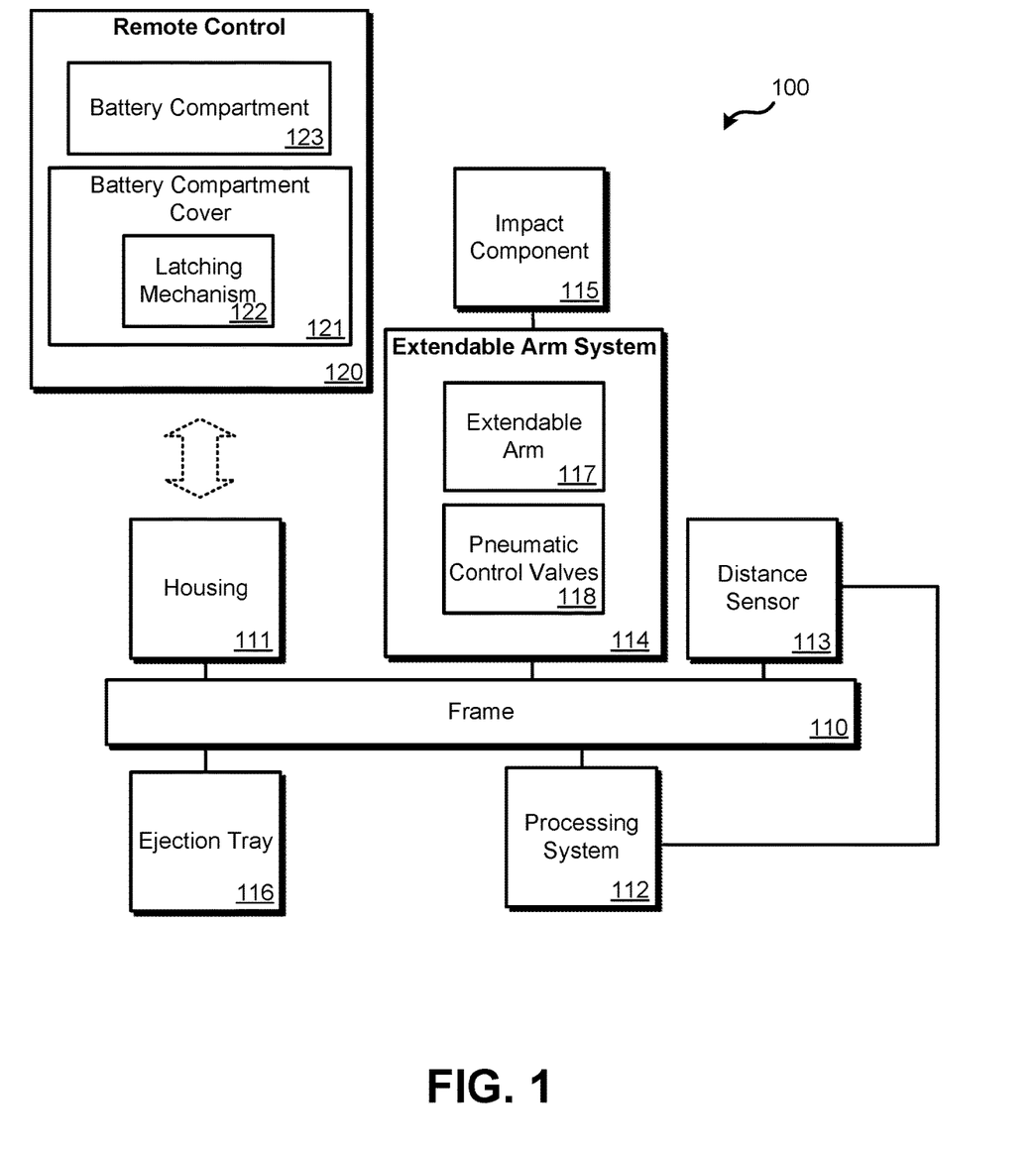
FIG. 1 illustrates an embodiment of a block diagram of a remote control battery compartment cover removal device.

Additional detail is provided in relation to the figures. FIG. 1 illustrates an embodiment of a block diagram of a remote control battery compartment cover removal system 100. System 100 can include: frame 110; housing 111; processing system 112; distance sensor 113; extendable arm system 114; impact component 115; and ejection tray 116. A remote control 120 may be used in conjunction with system 100 to remove a battery compartment cover 121 from remote control 120. Remote control 120 may include: battery compartment cover 121; latching mechanism 122; and battery compartment 123. It should be understood that only some of the components of remote control 120 and system 100 are illustrated for simplicity of FIG. 1.

Remote control 120 may be a television remote control, set top box (STB) remote control; digital video recorder (DVR) remote control; television receiver remote control, or some other form of remote control that controls electronic equipment. A service provider, such as a television service provider, may provide thousands of remote controls to its subscriber base to use on a rental or lease basis. After a period of time, at least some of the remote controls may be returned to the service provider. These remote controls may be reused by being distributed to other subscribers or customers. Prior to redistributing the remote controls, each remote control may be processed. Part of this processing may include removing one or more old batteries from a battery compartment of the remote control. New batteries may then be installed or the remote control may be provided to the next subscriber or customer without batteries.

Remote control 120 may have a battery compartment cover 121 which covers battery compartment 123. Battery compartment 123 may house one or more batteries and electrically connect the one or more batteries to electronic components of remote control 120. Battery compartment cover 121 may include a latching mechanism 122 that securely fastens battery compartment cover 121 to battery compartment 123. Latching mechanism 122 may be a tab or clip that can be actuated or moved by a user's finger to cause latching mechanism 122 to disengage from battery compartment 123. When battery compartment cover 121 is pushed against battery compartment 123, latching mechanism 122 may engage with a tab or slot of battery compartment 123. Battery compartment cover 121 may then remain attached with battery compartment 123 until latching mechanism 122 is actuated.

Frame 110 may be a metallic, wooden, or some other rigid or semi-rigid material to which other components of system 100 may be attached. Housing 111 may be shaped to receive remote control 120. Housing 111 may shaped to receive a particular make and/or model of remote control, in a particular orientation. Housing 111 may have one or more openings. A first opening may allow remote control 120 to be at least partially inserted into housing 111. Housing 111 may additional have an opening that allows access to battery compartment cover 121 while remote control 120 is inserted within housing 111. In some embodiments, one opening defined by housing 111 may be all for access to battery compartment cover 121 and for remote control 120 to be inserted into housing 111.

Processing system 112 may include one or more general-purpose or special-purpose processors, such as an application-specific integrated circuit (ASIC). A general-purpose processor may be configured to execute a set of stored instructions. In some embodiments a field programmable gate array (FPGA) may be configured to performed various functions. Processing system 112 may be mounted on a printed circuit board (PCB) and may be attached with frame 110. Processing system 112 may receive distance measurements from distance sensor 113. Processing system 112 may control extendable arm system 114.

Processing system 112 may compare distance measurements received from distance sensor 113 to one or more stored threshold distances. The one or more stored threshold distances may be used to distinguish the presence of remote control 120 that has battery compartment cover 121 attached from remote control 120 not being present and remote control 120 being present, but battery compartment cover 121 having been removed.

Distance sensor 113 may be a light-based time-of-flight (ToF) sensor. Distance sensor 113 may output light aimed at a location where battery compartment cover 121 is present when remote control 120 is inserted in housing 111. When remote control 120 is not present, a large distance is measured by distance sensor 113. When remote control 120 is present, but battery compartment cover 121 has been removed, an intermediate distance is measured by distance sensor 113. When remote control 120 is present and battery compartment cover 121 is attached with battery compartment 123, a shorter distance may be measured by distance sensor 113.

Extendable arm system 114 may include an extendable arm that can move between an extended position and a retracted position. Attached to an end of the extendable arm may be impact component 115. Impact component 115 may make contact with latching mechanism 122 when the extendable arm is extended while remote control 120 is inserted in housing 111. Impact component 115 may be rubber or some other compressible material. Impact component 115 may make contact with latching mechanism 122 at an angle such that latching mechanism 122 is actuated and disengaged from battery compartment 123, such as by a tab of latching mechanism 122 being depressed and released from battery compartment 123.

Extendable arm system 114 may include extendible arm 117 one or more pneumatic control valves 118. Processing system 112 may control when one or more pneumatic control valves 118 are opened and shut. Pneumatic control valves 118 may cause extendable arm 117 of extendable arm system 114 to extend to an extended position or retract to a retracted position.

Ejection tray 116 may receive battery compartment cover 121 when: impact component 115 has been pressed against and successfully disengaged latching mechanism 122; and extendable arm 117 has been retracted. Ejection tray 116 may be located below housing 111 such that when latching mechanism 122 is disengaged, battery compartment cover 121 falls into ejection tray 116 due to gravity.

Processing system 112 may cause extendable arm 117 to extend and retract multiple times for remote control 120. For instance, if a first attempt to disengage latching mechanism 122 is unsuccessful, processing system 112 can cause extendable arm 117 to re-extend one or more times to try again. Processing system 112 can determine if removal of battery compartment cover 121 is successful based on whether the distance measured by distance system 113 has increased from the distance measured when battery compartment cover 121 was attached with battery compartment 123.

Figure 2:
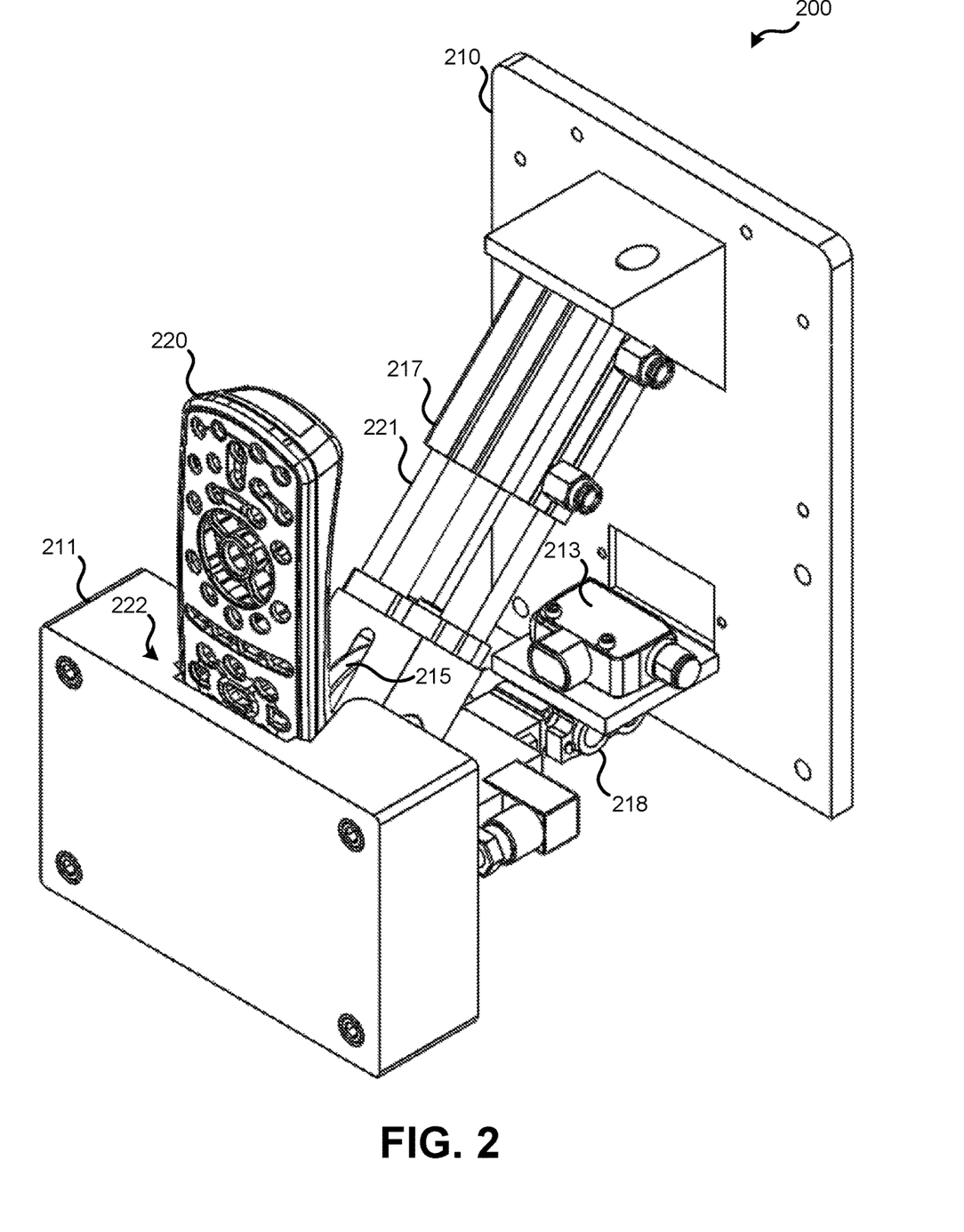
FIG. 2 illustrates an embodiment of a remote control battery compartment cover removal device with a remote control inserted.

FIG. 2 illustrates an embodiment of a remote control battery compartment cover removal device 200 with a remote control inserted. Remote control battery compartment cover removal device 200 can represent an embodiment of system 100. Remote control battery compartment cover removal device 200 can include: frame 210; housing 211; distance sensor 213; impact component 215; extendable arm 217; and pneumatic valves 218.

Remote control 220 may be inserted such that a face of remote control 220 on which buttons are present is inserted into housing 211 facing away from device 200. Housing 211 may have an opening 222 that allows remote control 220 to slide into housing 211 in a particular orientation such that a battery compartment of remote control 220 is exposed towards impact component 215.

Distance sensor 213 may measure a shorter distance when remote control 220 is inserted than when remote control 220 is not inserted. A processing system, not pictured, may control actuation of pneumatic valves 218, which controls extension and retraction of extendable arm 217. Extendable portion 221 of extendable arm is illustrated in FIG. 2 as extended. When retracted, extendable portion 221 may be retracted into extendable arm 217. Extendable arm 217 is attached with frame 210 at an angle such that when extendable portion 221 of extendable arm 217 is extended, impact component 215 can exert inward and downward pressure on a latching mechanism of the battery door component.

Housing 211 may be made from a rigid or semi-rigid material, such as metal, plastic, or wood. Similarly, frame 210, to which each component of remote control battery compartment cover removal device 200 is attached, may be made from a rigid or semi-rigid material, such as metal, plastic, or wood. Impact component 215 may be made from a compressible material such that when contact is made with a latching mechanism of remote control 220, a significant amount of friction is present and impact component 215 can partially conform to a shape of the latching mechanism to actuate it.

Not illustrated in FIG. 2 are pneumatic connections between pneumatic valves 218 and extendable arm 217. It should be understood that tubes or hoses may be used to connect extendable arm 217 to pneumatic valves 218 such that air pressure controlled by pneumatic valves 218 can be used to extend and retract extendable portion 221 of extendable arm 217. A processing system is not illustrated in FIG. 2. It should be understood that a processing system can be located in various locations and may be in electrical communication with pneumatic valves 218 and distance sensor 213. Such a processing system may receive periodic or occasional distance measurements from distance sensor 213 for use in comparing to one or more stored distance thresholds to determine when extendable arm 217 should be extended.

Figure 3:
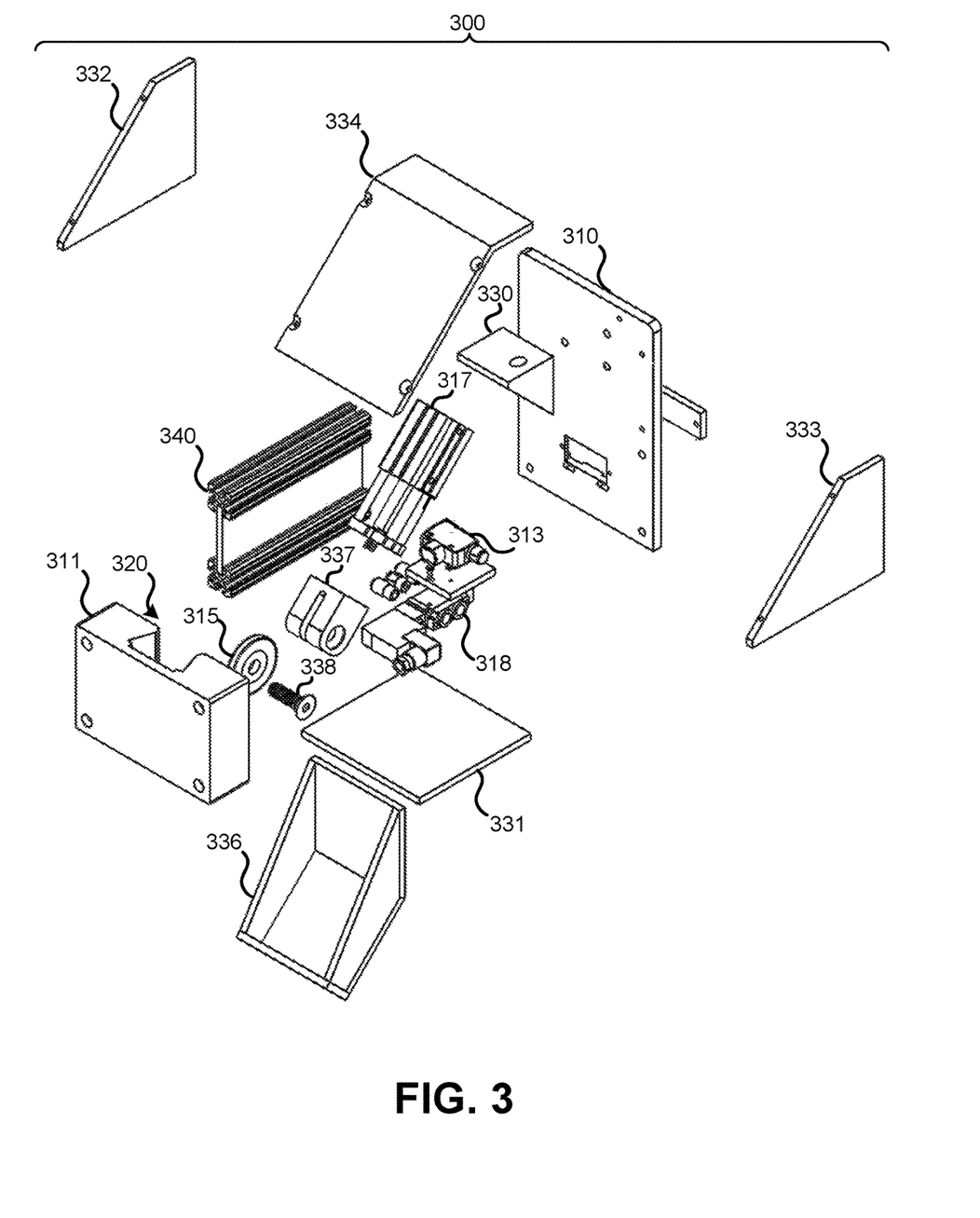
FIG. 3 illustrates an exploded view of a remote control battery compartment cover removal device.

FIG. 3 illustrates an exploded view of a remote control battery compartment cover removal device 300. Remote control battery compartment cover removal device 300 can represent an embodiment of remote control battery compartment cover removal device 200 and/or remote control battery compartment cover removal system 100. In the exploded view of FIG. 3, various components have been omitted for simplicity. For example, most fasteners have been omitted for simplicity of FIG. 3.

Remote control battery compartment cover removal device 300 may include the following components: frame base plate 310; housing 311; distance sensor 313; impact component 315; extendable arm 317; pneumatic valves 318; frame arm mount 330; frame bottom plate 331; side cover 332; side cover 333; top cover 334; ejection tray 336; impact component mount 337; impact component axis mount 338; and frame railing 340.

Figure 4:
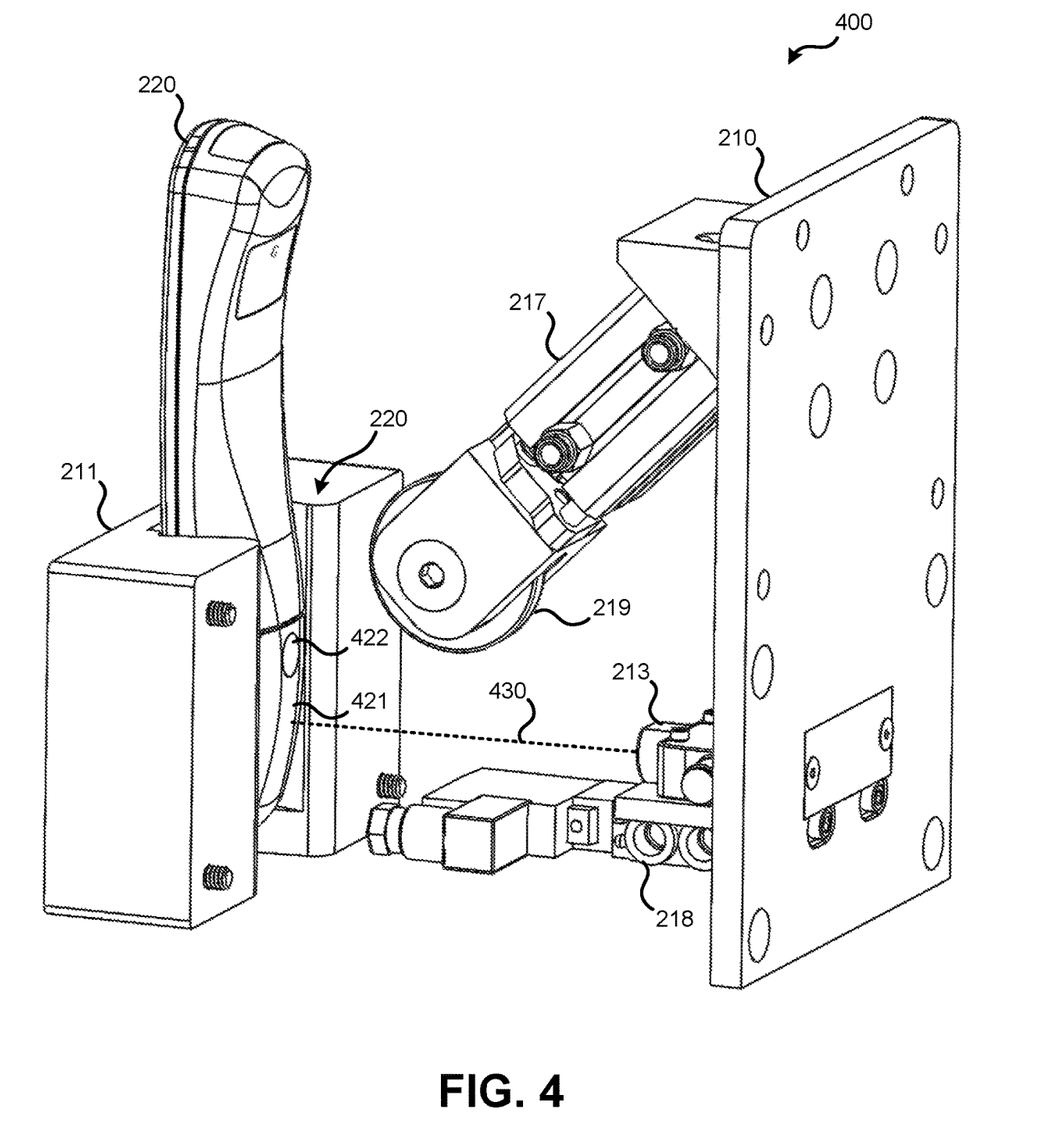
FIG. 4 illustrates an angled view of a remote control battery compartment cover removal device with the extendable arm retracted.
Figure 5:
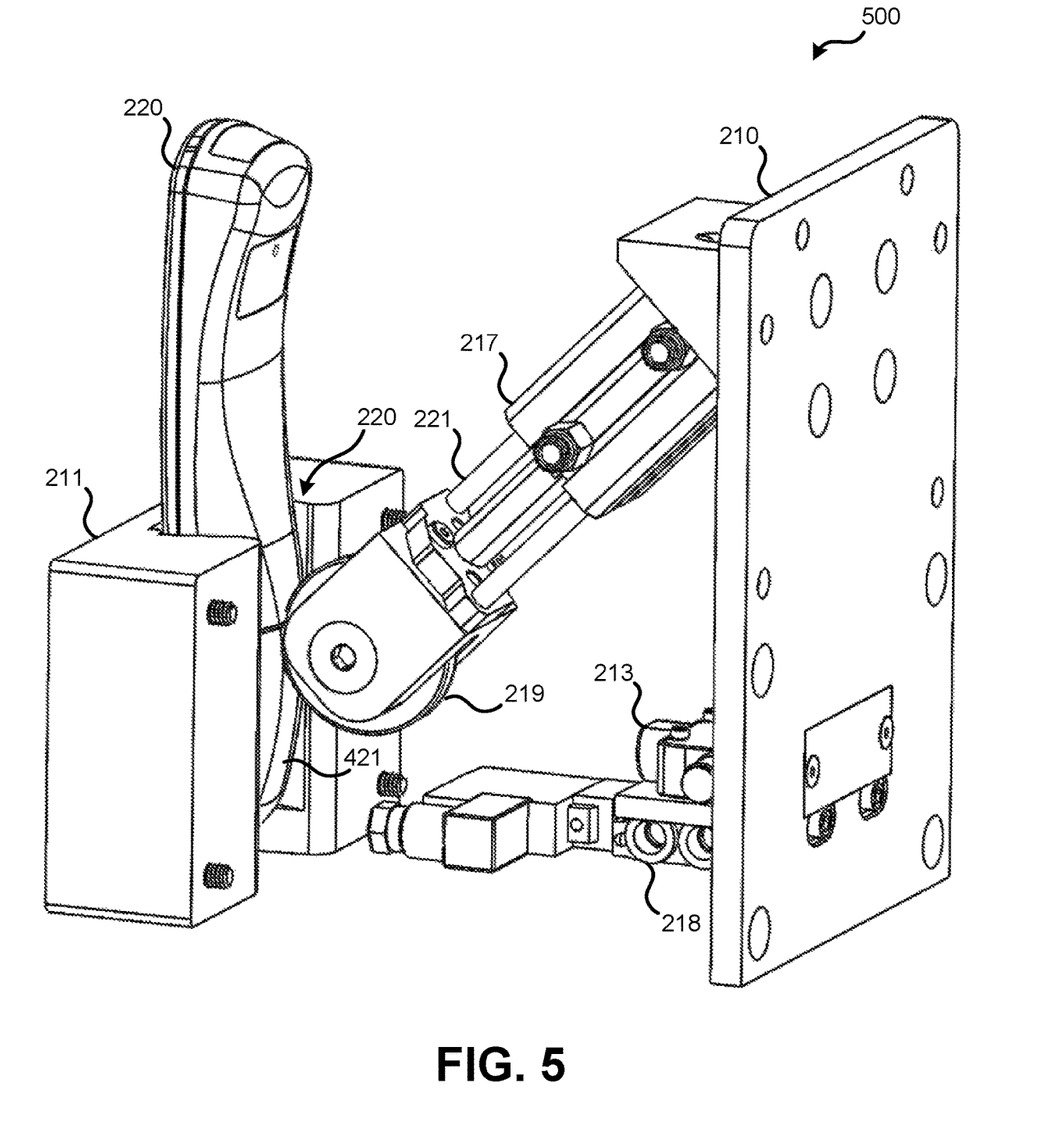
FIG. 5 illustrates an angled view of a remote control battery compartment cover removal device with the extendable arm extended.

Frame base plate 310; frame arm mount 330; frame bottom plate 331; and frame railing 340 may collectively form a frame to which other components of remote control battery compartment cover removal device 300 are attached. Each of these components may be made from metal or some other rigid or semi-rigid material. Side cover 332, side cover 333, and top cover 334 may be attached to components of the frame and may prevent a user from accidentally touching components that could cause injury. Side cover 332, side cover 333, and top cover 334 may be made from a transparent or semi-transparent material to allow a user to view the inner workings of device 300. Alternatively, side cover 332, side cover 333, and top cover 334 may be opaque. In FIGS. 2, 4, and 5, side cover 332, side cover 333, and top cover 334 have been omitted for simplicity of the figures and visibility of the internal components of the remote control battery compartment cover removal devices.

Housing 311 may define a slot 320 into which a remote control is inserted. Slot 320 may hold a remote control in place, but may permit access to a battery compartment of the remote control. Impact component 315 may be rounded, such as in the form of a wheel. Impact component axis mount 338 may hold impact component 315 in a fixed position to impact component mount 337. In other embodiments, impact component axis mount 338 may permit impact component 315 to rotate.

Ejection tray may be mounted to the frame to be generally below and behind slot 320. When a battery compartment cover's latching mechanism is disengaged and the battery compartment cover falls, the battery compartment cover falls into ejection tray 336. A lower surface of ejection tray 336 may be angled such that the battery compartment cover tends to fall or slide to a front region of ejection tray 336, thus making it more efficient for a user to retrieve the battery compartment cover.

Frame arm mount 330 may cause extendable arm 317 to be mounted at an angle relative to slot 320. The angle may be between 30°-60°. Such a range of angles may be found to provide sufficient pressure and friction for impact component 315 to actuate the latching mechanism of the remote control when extendable arm 317 is extended.

FIG. 4 illustrates an angled view of a remote control battery compartment cover removal device 400 with the extendable arm retracted. Remote control battery compartment cover removal device 400 can represent a different view of remote control battery compartment cover removal devices of FIGS. 2 and 3 and an embodiment of remote control battery compartment cover removal system 100.

Remote control battery compartment cover removal device 400 has extendable arm 217 in a fully retracted position. As such, impact component 219 is a distance from battery compartment cover 421. Battery compartment cover 421 may have release region 422. Release region 422 may be a location of battery compartment cover 421 where a user can manually push in and towards the bottom end (as illustrated) of remote control 220. This force as applied by a user may cause the latching mechanism of battery compartment cover 421 to release.

Path 430 illustrates the path along which distance sensor 213 measures distance. The distance measurement measures to a location on remote control 220 where battery compartment cover 421 is present. If battery compartment cover 421 is not present, a greater distance would be present and measured by distance sensor 213.

FIG. 5 illustrates an angled view of a remote control battery compartment cover removal device 500 with the extendable arm extended. Remote control battery compartment cover removal device 500 can represent remote control battery compartment cover removal device 400 with extendable portion 221 of extendable arm 217 extended. When extended, impact component 219, which is located at an end of extendable portion 221, exerts pressure against battery compartment cover 421 and pushes downward on battery compartment cover 421. Impact component 219 may press against release region 422, applying approximately the same force in approximately the same direction which a user could apply manually using a finger. This force may cause battery compartment cover 421 to disengage from the battery compartment of remote control 220. When extendable portion 221 is retracted, battery compartment door may fall, assisted by gravity, into an ejection tray located below remote control 220.

Figure 6A:
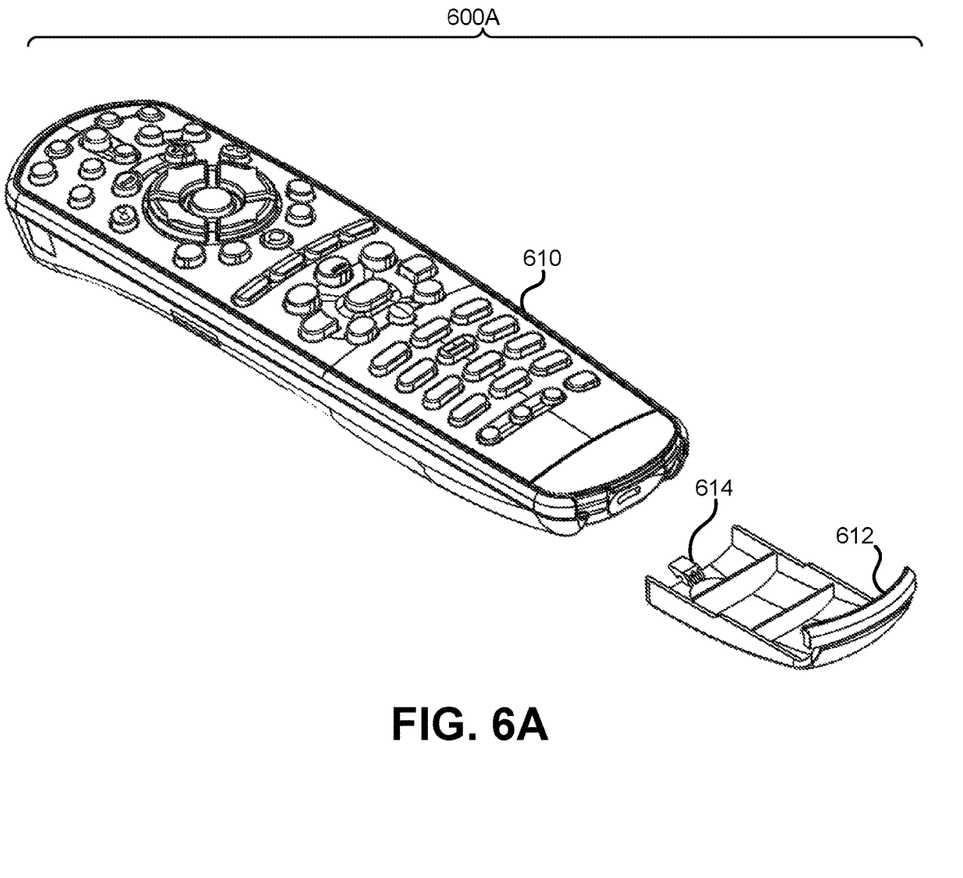
FIG. 6A illustrates an angled view of a top of a remote control with a battery compartment cover removed.

FIG. 6A illustrates an angled view of a remote control 600A with a battery compartment cover removed. Remote control 600A represents an embodiment of remote control 120 and 220. Battery compartment cover 612 can be removed from remote control body 610 by disengaging latching mechanism 614 from the body of remote control 600A. Latching mechanism 614 may be a clip that inserts into a hole on a body of remote control 600A to secure battery compartment cover 612 over the battery compartment.

Figure 6B:
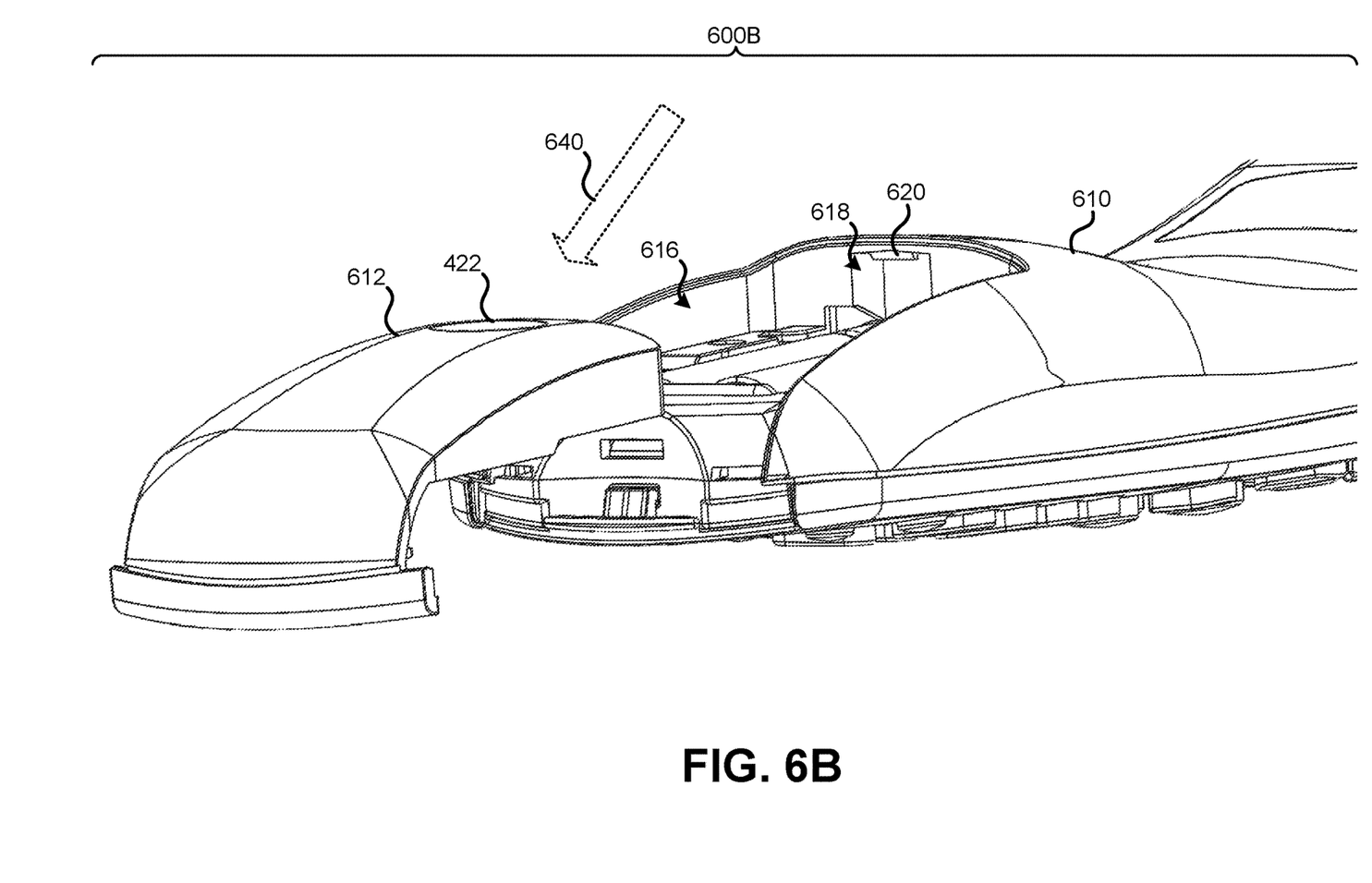
FIG. 6B illustrates an angled view of a bottom of a remote control with a battery compartment cover removed.
Figure 7:
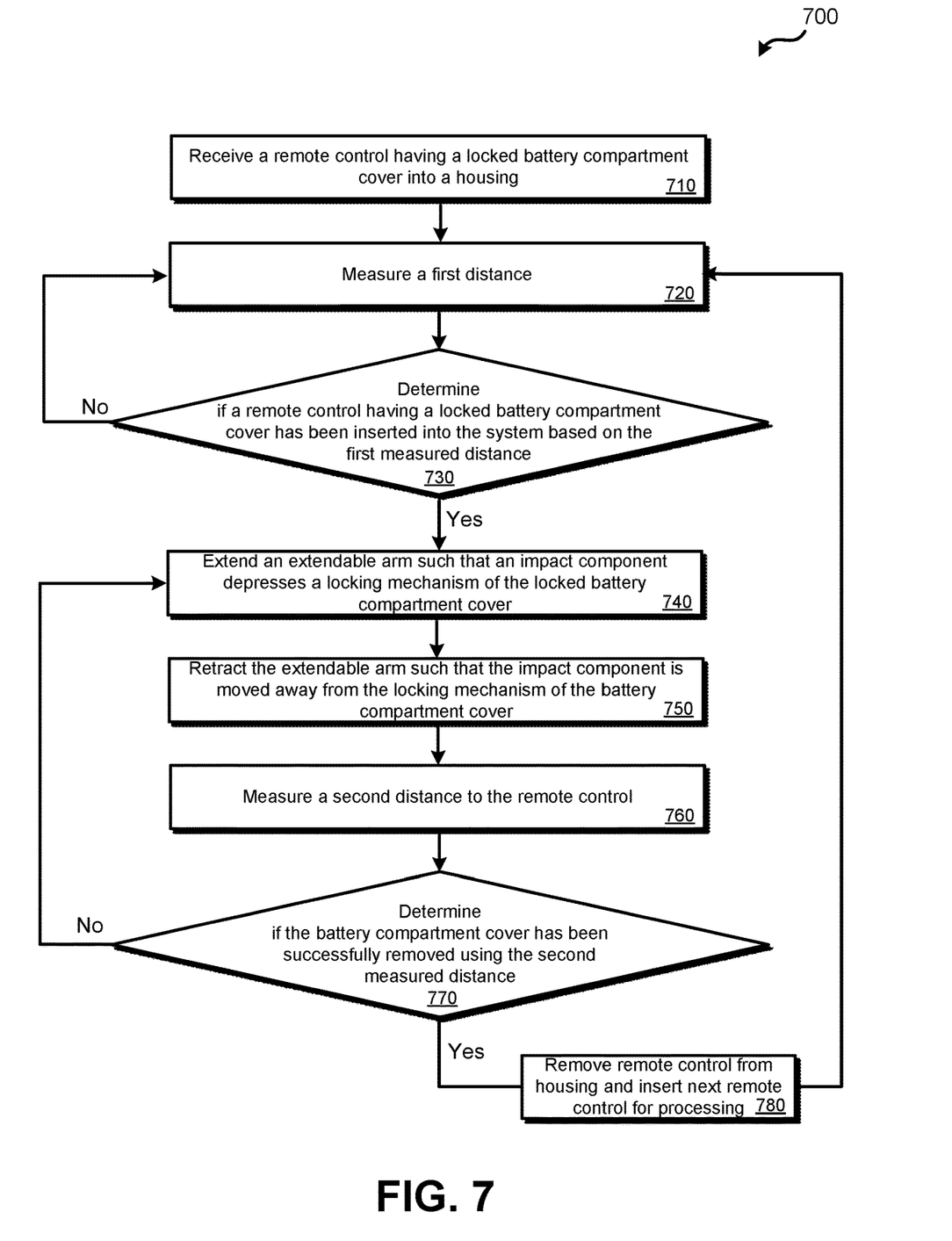
FIG. 7 illustrates an embodiment of a method for using a remote control battery compartment cover removal device.

FIG. 6B illustrates an angled view of a bottom of remote control body 610 with a battery compartment cover 612 removed. Battery compartment 616 is exposed by battery compartment cover 612 being removed. Latching mechanism 614 may engage with tab 620 within tab cutout 618 within battery compartment 616. By pressure applied in towards battery compartment 616 and towards an end of remote control body 610 being applied (illustrated by arrow 640) to (or near) release region 422 when battery compartment cover 612 is attached to remote control body 610, latching mechanism 614 can be moved and/or deformed such that it disengages from tab 620 and battery compartment cover 612 can move away from battery compartment 616. [0045] Various methods may be performed using the systems and devices of FIGS. 1-6. FIG. 7 illustrates an embodiment of a method 700 for using a remote control battery compartment cover removal device. In method 700, at block 710, a remote control may be inserted by a user in a particular orientation into a housing of a remote control battery compartment cover removal system or device. The remote control may have a closed or latched battery compartment in which one or more old or used batteries are present.

At block 720, a first distance may be measured by a distance sensor. The distance sensor may be a ToF sensor that measures a distance from the distance sensor to the latched battery compartment cover. This distance measurement may be provided to a processing system of the remote control battery compartment cover removal system.

At block 730, a determination of whether the remote control received into the housing has a latched battery compartment cover based on the measured first distance may be performed. This determination may be made by a processing system of the remote control battery compartment cover removal system. The determination may be made by comparing the measured first distance to a stored threshold distance. If the first measured distance is less than the stored threshold distance, it may be determined that a latched battery compartment cover is present. If the first measured distance is greater than the stored threshold distance, it may be determined that either no remote control is present or that a remote control that has already had its battery compartment cover removed is present (either way, there is no need to attempt to remove the battery compartment cover). If the determination of block 730 is that a remote control with a latched battery compartment cover is not present, method 700 may return to block 720 and repeat until block 730 is evaluated in the positive.

If the determination of block 730 is that a remote control with a latched battery compartment cover is present, method 700 may proceed to block 740. At block 740, an extendable arm may be extended such that an impact component positioned at an end of the extendable arm impacts the latching mechanism of the battery compartment cover of the remote control. This impact may move and/or deform the latching mechanism and cause it to disengage from the battery compartment, thus transitioning from a latched (or engaged) state to an unlocked (or disengaged) state. The extendable arm may be extended by the processing system of the system actuating one or more pneumatic valves that causes air pressure to extend the extendable arm.

At block 750, the extendable arm may be retracted such that the impact component is moved away from the latching mechanism and the battery compartment cover. The extendable arm may be retracted by the processing system of the system actuating one or more pneumatic valves that causes air pressure to cause the extendable arm to move to the retracted position. If the latching mechanism was successfully disengaged, the battery compartment door may fall or otherwise move away from the remote control and the battery compartment when the extendable arm is retracted.

At block 760, a second distance may be measured by the distance sensor. The distance sensor may measure the distance from the distance sensor to either the latched battery compartment cover or the internal region of the battery compartment if the cover was successfully disengaged and removed. This second distance measurement may be provided to a processing system of the remote control battery compartment cover removal system.

At block 770, a determination of whether the battery compartment cover was successfully unlocked and removed at blocks 740 and 750. This determination may be made by the processing system based on the second measured distance of block 760. For instance, a threshold distance may be greater than the distance expected to be measured when the battery compartment door is present, but shorter than the distance to the one or more batteries within the battery compartment. Therefore, if the distance measurement is less than the threshold, block 770 is determined in the negative; if the distance measurement is greater than the threshold, block 770 is determined in the positive.

If block 770 is determined in the negative, method 700 may proceed to block 740 and the extendable arm may be extended, again, in a second (or later) attempt to disengage the latching mechanism of the battery compartment cover. A delay may be built in, such that following block 770, at least one second (or some greater or shorter period of time) is waited before block 740 is performed again. This delay may allow a user to remove the remote control from the housing if the user no longer desires the system to attempt to remove the battery compartment cover.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known, processes, structures, and techniques have been shown without unnecessary detail in order to avoid obscuring the embodiments. The preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A remote control battery compartment cover removal system, comprising:
   a frame;
   a housing, attached with the frame, wherein:
      the housing is shaped to allow at least a portion of a remote control to be inserted into the housing; and
      the housing provides access to a battery compartment cover of the remote control when the remote control is inserted into the housing;
   a sensor, attached with the frame, that measures a plurality of distance measurements from the sensor to the remote control when the remote control is inserted into the housing;
   an extendable arm, attached with the frame, that is extended at least partially based on one or more distance measurements of the plurality of distance measurements measured by the sensor; and
   a compressible impact component, attached with the extendable arm, that extends beyond an end of the extendable arm, wherein:

the compressible impact component is attached with the extendable arm, such that when the extendable arm is extended from an unextended position and the remote control is inserted into the housing, the compressible impact component actuates a latching mechanism of the battery compartment cover.

2. The remote control battery compartment cover removal system of claim 1, further comprising an ejection tray, attached with the frame, positioned to receive the battery compartment cover when the compressible impact component has actuated the latching mechanism of the battery compartment cover and the extendable arm has been retracted.

3. The remote control battery compartment cover removal system of claim 2, wherein gravity causes the battery compartment cover to fall into the ejection tray when the compressible impact component has actuated the latching mechanism of the battery compartment cover and the extendable arm has been retracted.

4. The remote control battery compartment cover removal system of claim 1, further comprising a processor, wherein the processor is configured to receive the plurality of distance measurements and to control the extendable arm at least partially based on the plurality of distance measurements.

5. The remote control battery compartment cover removal system of claim 4, wherein the processor is configured to:
receive a distance measurement of the plurality of distance measurements, wherein the distance measurement is made by the sensor after the extendable arm has been extended and retracted to the unextended position and the remote control remains inserted into the housing.

6. The remote control battery compartment cover removal system of claim 5, wherein the processor is further configured to:
determine, based on the distance measurement, that the battery compartment cover remains attached to the remote control; and
in response to determining that the battery compartment cover remains attached to the remote control, cause the extendable arm to again extend from the unextended position such that the compressible impact component actuates the latching mechanism of the battery compartment cover again.

7. The remote control battery compartment cover removal system of claim 5, wherein the processor is further configured to:
determine, based on the distance measurement, that the battery compartment cover has been detached from the remote control; and
in response to determining that the battery compartment cover has been detached from the remote control, cause the extendable arm to remain in the unextended position at least until the remote control is removed from the housing.

8. The remote control battery compartment cover removal system of claim 1, wherein the compressible impact component is rounded and rubber.

9. The remote control battery compartment cover removal system of claim 1, wherein the extendable arm is caused to extend and retract using pneumatics.

10. The remote control battery compartment cover removal system of claim 1, wherein the remote control is a television set top box (STB) remote control.

11. An apparatus for removing a remote control battery compartment cover from a remote control, the apparatus comprising:
means for holding a remote control having a latched battery compartment cover such that access to a battery compartment cover of the remote control is provided;
means for measuring a distance measurement to the latched battery compartment cover;
means for extending an extendable arm based on the distance measurement, wherein extending the extendable arm causes an impact component to impact the latched battery compartment cover and attempt to unlatch the latched battery compartment cover; and
means for retracting the extendable arm to an unextended position such that the impact component is moved away from the remote control battery compartment cover.

12. The apparatus for removing the remote control battery compartment cover of claim 11, further comprising a processing means that analyzes the distance measurement made by the means for measuring the distance measurement.

* * * * *